(12) United States Patent
Andreini et al.

(10) Patent No.: US 7,126,230 B2
(45) Date of Patent: Oct. 24, 2006

(54) SEMICONDUCTOR ELECTRONIC DEVICE AND METHOD OF MANUFACTURING THEREOF

(75) Inventors: Antonio Andreini, Usmate Velate (IT); Lorenzo Cerati, Cinisello Balsamo (IT); Paola Galbiati, Monza (IT); Alessandra Merlini, Albiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/864,901

(22) Filed: Jun. 9, 2004

(65) Prior Publication Data

US 2005/0035468 A1    Feb. 17, 2005

(30) Foreign Application Priority Data

Jun. 10, 2003   (EP)   ................................. 03425368

(51) Int. Cl.
   *H01L 29/40*   (2006.01)
(52) U.S. Cl. .................... 257/786; 257/784; 257/691
(58) Field of Classification Search ................ 257/691, 257/758, 784, 786, 48
   See application file for complete search history.

(56) References Cited

U.S. PATENT DOCUMENTS

| | | | |
|---|---|---|---|
| 5,424,248 A * | 6/1995 | Doi ............................. 438/599 |
| 5,643,830 A | 7/1997 | Rostoker et al. ............. 437/180 |
| 6,093,942 A * | 7/2000 | Sei et al. ...................... 257/203 |
| 6,222,270 B1 | 4/2001 | Lee .............................. 257/758 |
| 6,246,112 B1 * | 6/2001 | Ball et al. .................... 257/690 |
| 6,528,734 B1 * | 3/2003 | Mizunashi ................... 174/255 |
| 6,591,410 B1 * | 7/2003 | Ali et al. ....................... 716/12 |
| 6,608,368 B1 * | 8/2003 | Ohashi ........................ 257/668 |
| 6,849,956 B1 * | 2/2005 | Shigihara ..................... 257/786 |
| 6,888,254 B1 * | 5/2005 | Yamaguchi et al. ........ 257/775 |
| 2001/0000116 A1 * | 4/2001 | Shimizu et al. ............. 257/786 |
| 2004/0004296 A1 * | 1/2004 | Cheng et al. ................ 257/786 |
| 2005/0056932 A1 * | 3/2005 | Shinjo ......................... 257/737 |

FOREIGN PATENT DOCUMENTS

EP    0 902 471 A2    3/1999

* cited by examiner

*Primary Examiner*—S. V. Clark
(74) *Attorney, Agent, or Firm*—Lisa K. Jorgenson; Hai Han; Seed IP Law Group PLLC

(57) ABSTRACT

A semiconductor electronic device is described comprising a die of semiconductor material having a plurality of contact pads electrically connected to a support for example through interposition of contact wires, said plurality of contact pads comprising signal pads and power pads, the device being characterized in that said signal pads are implemented on the die of semiconductor material with a mutual pitch lower than the pitch between said power pads.

18 Claims, 2 Drawing Sheets

SEMICONDUCTOR ELECTRONIC DEVICE AND METHOD OF MANUFACTURING THEREOF

BACKGROUND OF THE INVENTION

1. Field of Application

In its more general aspect, the present invention relates to an electronic device of the type comprising a die of semiconductor material having a plurality of contact pads connected, e.g., through contact wires, to a support or an integrated circuit having electrically conductive areas or regions.

In particular, the present invention relates to a semiconductor device as above that can incorporate a higher number of functions while maintaining the same size for the die of semiconductor material or have a smaller die of semiconductor material with the same number of functions therein incorporated.

The present invention also relates to a method for manufacturing a semiconductor electronic device of the above type.

2. Description of the Related Art

As it is well known, the semiconductor electronic devices, such as power devices, comprise a die of semiconductor material, the so-called die, is a few square millimeter area whereon an electronic circuit is monolithically integrated. The die has a plurality of terminals, typically contact pads (the so-called pads) superficially formed and electrically interconnected with a support, the so-called lead frame, also being part of the electronic device.

The electrical connection between the die of semiconductor material and the support can be realized through different technologies, among which the most employed provides the use of contact wires and is therefore known as wire bonding. More particularly, each contact wire is welded at an end on a contact pad formed on the die of semiconductor material and, at the opposite end, on a corresponding contact pad formed on the support whereto the die has to be connected.

The contact pads, generally numbering in the hundreds, are arranged on the surface of the die of semiconductor material and along the boundary thereof. They can be substantially arranged according to two typologies: linear and staggered.

In the linear disposition, the contact pads are arranged in a single chain along the sides of the die of semiconductor material. In such a way, however, it is possible to arrange only a limited number of contact pads, otherwise sizes and costs for manufacturing the die of semiconductor material would be increased.

Instead, in the staggered arrangement, each side of the die of semiconductor material has two contact pad chains that are staggered relative to each other. The staggered arrangement has thus the advantage of making the die of semiconductor material more compact.

Generally, the contact pads arranged on a die of semiconductor material have a multilayer structure comprising metallic material layers (generally aluminum or copper) alternated by insulating material layers. Of these layers, the upper terminal or more external layer, which is of metallic material, is used for connection with the contact wires and one of the metallic layers is in communication with the circuit components of the die of semiconductor material. Moreover the metallic layers of the contact pads are in communication with each other through contact holes.

In the field of the design of integrated circuits, it is known the use of dies of semiconductor material whereon contact pads are implemented, these pads being connected with blocks integrating signal functions (later on simply indicated as signal pads) and distinct contact pads connected with blocks integrating power functions (later on simply indicated as power pads).

In this technical field, it is also known the more and more compelling need of reducing the size of the dies of semiconductor material without reducing the number of functions implemented thereon, in order to reach a reduction of the manufacturing costs and more compact electronic devices. Another need, which is strictly related to the one above, is instead that of increasing the number of functions in the dies of semiconductor material without increasing their size in order to have more efficient semiconductor electronic devices being at the same time fairly compact.

There remains a need in the art to provide a semiconductor electronic device having such structural and functional characteristics as to satisfy the above needs.

BRIEF SUMMARY OF THE INVENTION

The solution idea is that of reducing the pitch between contact pads as much as possible, the word "pitch" being the distance between two equivalent points of adjacent pads, such as for example two corresponding ends.

On the basis of this solution idea, one embodiment according to the present invention provides a semiconductor electronic device comprising a die of semiconductor material whereon a plurality of contact pads are implemented to be electrically connected to a support, said plurality of contact pads comprising signal pads and power pads, characterized in that said signal pads are implemented on the die of semiconductor material having a pitch between the adjacent signal pads narrower than the pitch between the adjacent power pads.

Preferably, the pitch between signal pads is lower than 90 microns and the pitch between power pads is preferably equal or higher than 90 microns.

Preferably, the signal and power pads are implemented in distinct regions of the die of semiconductor material.

Preferably, both the signal and power pads have a multilayer structure composed of metallic layers alternated by insulating material layers and ending upperly or outwards with a metallic material layer.

In particular, the upper metallic layer, terminal or more external, of the signal pads has a thickness lower or equal to 2 microns whereas the upper metallic layer, terminal or more external, of the power pads has a thickness higher than 2 microns in order to afford high intensity currents.

Moreover, the terminal upper metallic layer of the signal pads is preferably arranged at a lower level with respect to that of the terminal upper metallic layer of the power pads.

The metallic material forming the metallic layers of the signal and power pads is of the conventional type and is preferably chosen among aluminum, copper and their alloys.

The insulating material is of the conventional type and is preferably chosen among silicon oxides and nitrides or other insulating materials containing silicon.

Preferably, the electrical connection between the contact pads and the support is performed through contact wire interposition.

The present invention also relates to a method for manufacturing a semiconductor electronic device comprising a die of semiconductor material having a plurality of power and signal pads electrically connected to a support, the method being characterized in that it comprises the steps of:

forming on the die of semiconductor material a first plurality of stripes separated with a predetermined pitch between adjacent stripes, each stripe comprising at least a layer of metallic material, forming on the die of semiconductor material a second plurality of stripes separated with a predetermined pitch between adjacent stripes being narrower than that between the adjacent stripes of the first plurality of stripes, each stripe of the second plurality of stripes comprising at least a metallic material layer, forming an insulating material layer on each stripe of said first and second plurality of stripes, forming a metallic material layer on each insulating material layer on a stripe of said plurality of first stripes, said metallic layer being thicker than 2 microns, covering the die of semiconductor material with a passivating material layer in order to cover said plurality of first stripes, said plurality of second stripes, said insulating material layers and said metallic material layers formed on the insulating material layers, selectively etching said passivating material layer in correspondence of the metallic material layers formed on the insulating material layers on the stripes of the first plurality in order to expose superficial portions of said metallic material layers, thus obtaining said plurality of power pads, selectively etching said passivating material layer and said insulating material layer on the stripes of said second plurality in order to expose superficial portions of said stripes of the second plurality, thus obtaining said plurality of signal pads.

Preferably, the pitch between adjacent stripes of the first plurality of stripes is equal or higher than 90 microns whereas the pitch between adjacent stripes of the second plurality of stripes is lower than 90 microns.

Preferably, said first plurality of stripes and said second plurality of stripes are formed on distinct regions of the die of semiconductor material.

Preferably, the stripes of the first plurality and of the second plurality have each a multilayer structure comprising a plurality of metallic layers alternated by insulating material layers and ending on top with a metallic material layer.

The formation of the stripes of the first plurality and of the second plurality, which is of the metallic layers and of the insulating material layers between the metallic layers composing these stripes, can be performed in a conventional way by means of deposition, etching and photolithographic techniques. These techniques entail the common steps of deposition of one or more layers, of masking with resist or similar material, selective exposition of the resist to radiant energy and selective removal of the resist and of portions of said layers.

The formation of the insulating material layer on the stripes of the first plurality and of the second plurality and the formation of the metallic material layers on the insulating material layers on the stripes of the first plurality can be performed in a conventional way for instance by using the deposition, etching and photolithographic techniques as above.

Further characteristics and advantages of the semiconductor electronic device according to the present invention will be better understood in the following description made with reference to the drawings herewith attached and given for illustration convenience only.

DETAILED DESCRIPTION OF THE INVENTION

Figure 1:
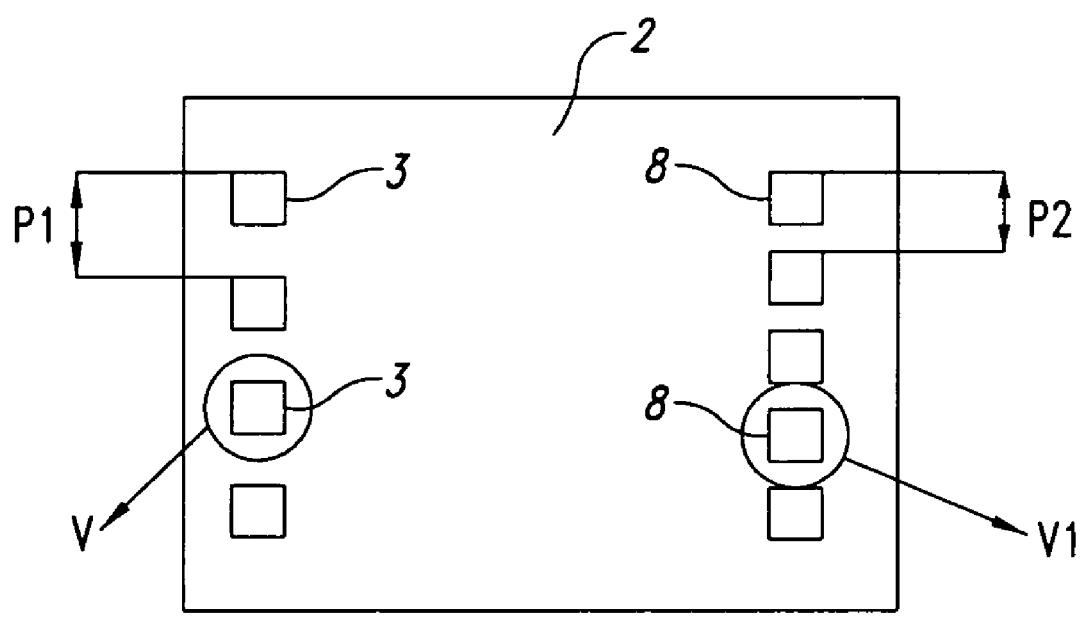
FIG. 1 schematically shows a die of a semiconductor electronic device whereon both power and signal pads have been implemented, FIG. 2 schematically shows a portion of the die of FIG. 1 whereon a power pad has been implemented according to the method of the invention, FIG. 3 schematically shows a portion of the die of FIG. 1 whereon a signal pad has been implemented according to the method of the invention.

It has been found that the reduction of the pitch between contact pads can entail different drawbacks if power and signal pads are implemented on the die of semiconductor material. In particular, if only signal pads are implemented it is generally possible to use reduced pitches for implementing the contact pads without causing functionality problems of the die of semiconductor material and so of the semiconductor electronic device that has to be manufactured in the end. So, signal pads can be efficiently implemented with a pitch equal, for example, to 65 microns.

Differently, the implementation of power pads on a die of semiconductor material requires the use of pitches between pads being notably wider than those used between signal pads in order not to compromise the correct functionality of the die of semiconductor material and so of the final device.

In fact, the power functions, differently with respect to the signal ones, require a greater thickness for the upper terminal metallic layer (higher than 2 microns) in order to afford high intensity electric currents. In the following connection between power pads and their relevant contact wires, this metallic layer, of relatively high thickness, can introduce some critical aspects that can cause malfunction in the semiconductor electronic device.

For instance, if a reduced pitch is used (e.g., less than 90 microns) in the implementation of power pads, due to pressures exerted during the process for connecting contact pads with the support, the upper terminal metallic layer can deform in such a way as to push the metallic material out of the edges of the contact pad, with the consequence of having a high risk of short circuit between adjacent contact pads.

In certain incidents, the deformation of the external metallic layer can be so pronounced that it has implied the breakage of the passivating material layer covering the die of the semiconductor material.

As shown in further examples, it can happen that the adhesion of the contact wire on the thicker metallic layer of the contact pad is not satisfactory. This can cause the detachment of the contact wires from the contact pads.

The present invention allows for overcoming smartly these drawbacks by implementing on a single die of semiconductor material both power and signal pads, keeping however the conventional pitches between power pads and reducing the pitches between signal pads. This is particularly advantageous because it allows for obtaining highly reliable semiconductor electronic devices, being more compact and/or more efficient.

The process steps described hereinafter are not a complete process flow for manufacturing integrated circuits. The present invention can be implemented together with manufacturing techniques for integrated circuits currently used in this field, and only those commonly used process steps that are necessary to understand this invention are included in the description.

The drawings showing schematic or sectional views of portions of an integrated circuit during manufacturing are not drawn to scale, but only schematically in order to show the essential characteristics of the present invention. In the drawings the same reference numbers will be given to functionally identical or equivalent structural elements.

With reference to FIGS. from 1 to 3, the semiconductor electronic device according to the invention comprises a die 2 of semiconductor material whereon, in distinct regions, a plurality of power pads 3 and a plurality of signal pads 8 are implemented. The power pads 3 are implemented with a pitch P1 between adjacent pads preferably more than or equal to 90 microns whereas signal pads 8 are implemented with a pitch P2 between adjacent pads preferably less than 90 microns.

Figure 2:
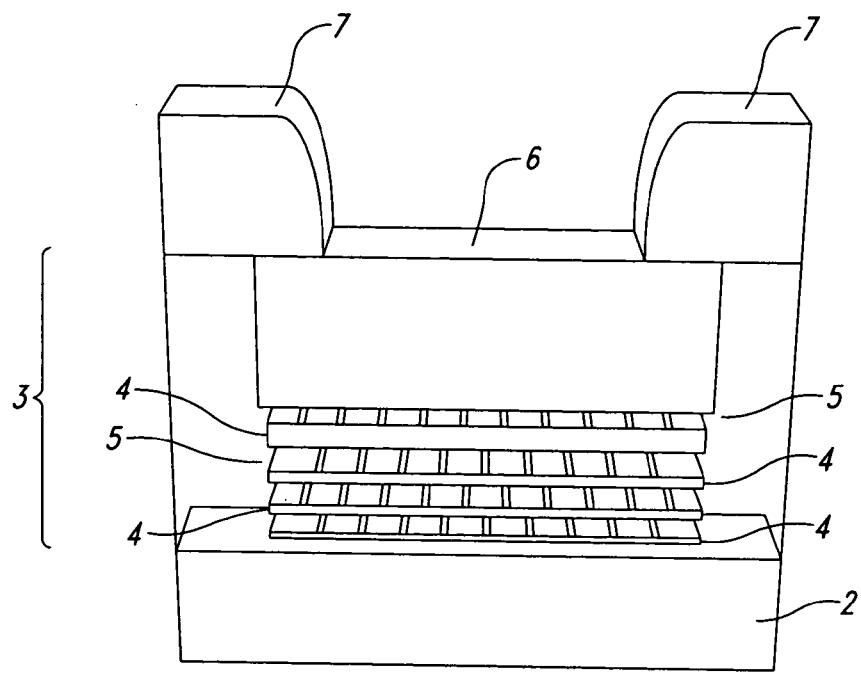

With reference to FIG. 2, a portion of a die 2 of semiconductor material is shown whereon power pads 3 are implemented. For simplicity sake only one power pad is shown The power pad 3 comprises a plurality of lower or more internal metallic layers 4 generally of reduced thickness (in the drawing four are shown) alternated by an insulating material layer 5 and a terminal or more external upper layer 6 of metallic material thicker than any individual internal metallic layers. The thickness and the number of the plurality of the lower metallic layers 4 is suitably designed according to the characteristics of functionality and applicability desired in semiconductor electronic devices. In general, only one lower metallic material layer 4 on the die 2 of semiconductor material is sufficient even if several are preferably applied. Generally, the more internal metallic layers can also not be connected directly with the more external layers through contact holes.

The thickness of the lower metallic layers 4 is generally less than or equal to 2 microns and it is preferably between 0.4 and 1 microns.

The upper terminal metallic material layer 6 is more than 2 microns in thickness. Such a thickness is indispensable so that the upper metallic layer 6 can afford high current intensities and so be used in the power pad 3.

The die 2 of semiconductor material is usually covered with a passivating material layer indicated with 7. The material of such a layer can be preferably chosen among silicon oxides and nitrides.

In FIG. 2, this passivating material layer 7 is open in correspondence with the power pad 3 shown in order to expose a portion of the upper terminal metallic layer 6. In this way, the electrical connection of the contact pad 3 with other components, e.g., a support, can be implemented.

The implementation, on the die 2 of semiconductor material, of the lower metallic material layers 4, of the insulating material layers 5 and of the upper metallic material layer 6 can be performed by means of conventional deposition, etching and photolithographic techniques. In practice, by using these techniques at first a first lower layer 4 is defined, then an insulating material layer 5 and again a second metallic material layer 4, thus reaching the definition of the upper terminal metallic material layer 6.

Subsequently, the die 2 of semiconductor material is covered with the passivating material layer 7 and then this passivating material layer is selectively etched in order to expose in the case of power pads 3 a superficial portion of the upper metallic material layer 6.

Figure 3:
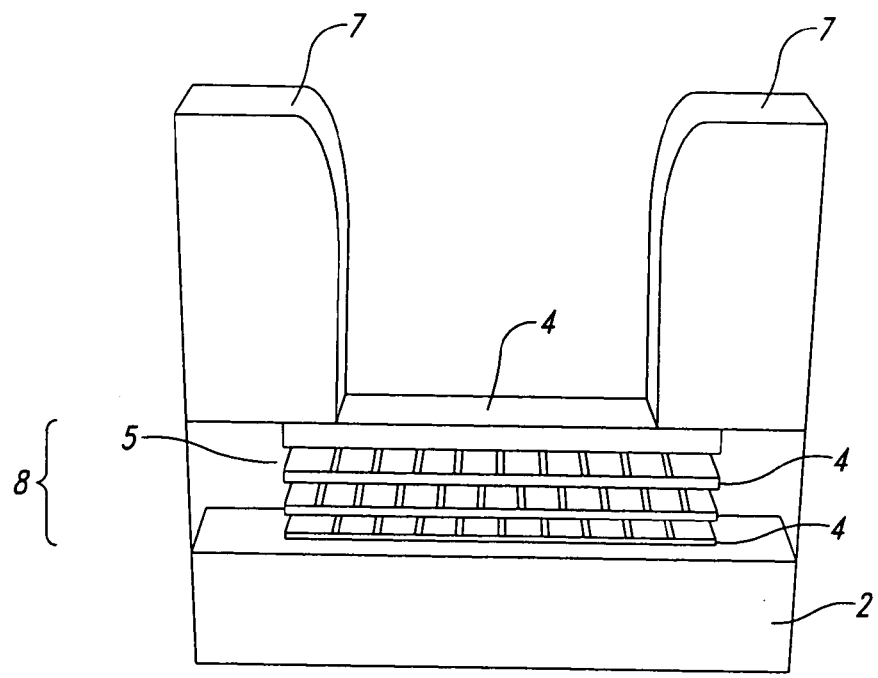

Now, with reference to FIG. 3, a portion of a die 2 of semiconductor material is shown whereon signal pads 8 are implemented. For simplicity sake only one signal pad is shown Generally, the more internal metallic layers can also not be connected directly with the more external layers through contact holes.

If comparing FIG. 2 with 3 it can be seen that the signal pad 8 is structurally completely equal to the power pad 3 except for the fact that the signal pad 8 omits the upper terminal or more external layer 6 of greater thickness, which, in fact, is not defined here. In the signal pad 8 this upper or more external layer is thus represented by the metallic material layer 4 lastly defined.

As the definition of the layers of the power pads 3 and of the signal pads 8 is performed simultaneously, the lastly defined metallic layer 4 of the signal pads 3 will rank at a lower level with respect to the upper metallic layer 6 of the power pads.

As previously mentioned, the passivating material layer 7 is selectively etched. In correspondence with the signal pads 8 this selective etching also extends to the upper or more external insulating material layer 5 applied on the lastly defined metallic layer 4. In this way an opening is formed in the passivating material layer 7 and in the upper insulating material layer 5, which allows a superficial portion of the more external metallic layer 4 to be exposed, this portion will be then employed for electrical connection through contact wires with other components, e.g., a support.

A first important aspect of one embodiment of the present invention stays in the possibility of forming in a simple way a more external, thicker metallic layer (i.e., able to afford high intensity electric currents) only on power pads. This is performed during the formation step of a metallic layer, which is thicker than 2 microns only on the insulating material of the first plurality of stripes.

In this way, power pads can be advantageously distinguished from signal pads because, thanks to the method of the invention, they are formed with distinct architectures due to the fact that the terminal upper metallic layer of the signal pads is at a lower level with respect to that of the terminal upper metallic layer of the power pads.

A second important aspect of one embodiment according to the present invention is the possibility of simultaneously performing the selective etching steps of the passivating material layer on the first plurality of stripes and of selective etching of the passivating material layer and of the insulating material layer on the second plurality of stripes.

In fact, it is possible to use a single etching means that is able to selectively remove, with respect to the metallic layers, both the material of the passivating layer and the material of the underlying insulating layer. Such a selective etching means can be chosen among any method for selective etching of dielectric materials. In view of the high selectivity of these means, the extension of the etching to the insulating material layer on the stripes of the second plurality does not imply a considerable removal or overetch of the metal being already exposed on the stripes of the first plurality as the effect of the preceding selective removal of the passivating material layer.

In this way a higher speed of the manufacturing process is achieved as well as a reduction of the costs for manufacturing semiconductor electronic devices. If desired, it is however possible to perform the removal of the passivating material layer on the stripes of the first plurality and the removal of the passivating material layer and of the insulating material layer on the stripes of the second plurality in two different steps.

The main advantage of the present invention is that by implementing power and signal pads on a single die of semiconductor material and by reducing the pitch only between signal pads the size of the die of semiconductor material can be reduced while maintaining the same number of functions implemented thereon or these functions can be increased in number while substantially maintaining at the same time the original size of the die of semiconductor material. This advantageously allows for obtaining semiconductor electronic devices with high reliability, being more compact and/or efficient.

Another advantage of the present invention is that semiconductor electronic devices can be manufactured at low production costs and with improved speed in the manufacturing process.

A further advantage of the present invention is that power and signal pads can be implemented on the die of semiconductor material in a linear or staggered arrangement.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous variations and modifications may be made to process and material described and illustrated herein, all falling within the scope of the invention as defined in the attached claims.

The invention claimed is:

1. A semiconductor electronic device comprising a die of semiconductor material having a plurality of contact pads electrically connected to a support, said plurality of contact pads comprising signal pads and power pads, wherein said signal pads are implemented on the die of semiconductor material with a pitch narrower than a pitch between said power pads, wherein the pitch between the signal pads is less than 90 microns and the pitch between the power pads is equal or more than 90 microns.

2. The semiconductor electronic device according to claim 1 wherein said signal pads and said power pads are implemented in distinct regions of the die of semiconductor material.

3. A semiconductor electronic device comprising a die of semiconductor material having a plurality of contact pads electrically connected to a support, said plurality of contact pads comprising signal pads and power pads, wherein said signal pads are implemented on the die of semiconductor material with a pitch narrower than a pitch between said power pad, wherein said signal pads have a multilayer structure comprising metallic layers alternated by insulating material layers and upperly ending with a terminal metallic material layer.

4. The semiconductor electronic device according to claim 3 wherein said upper terminal metallic material layer of said signal pads has a thickness less than or equal to 2 microns.

5. A semiconductor electronic device comprising a die of semiconductor material having a plurality of contact pads electrically connected to a support, said plurality of contact pads comprising signal pads and power pads, wherein said signal pads are implemented on the die of semiconductor material with a pitch narrower than a pitch between said power pad, wherein said power pads have a multilayer structure comprising first metallic layers alternated by insulating material layers and upperly ending with a second terminal metallic material layer.

6. The semiconductor electronic device according to claim 5 wherein said second upper terminal metallic material layer of said power pads has a thickness of more than 2 microns.

7. The semiconductor electronic device according to claim 6 wherein each upper terminal metallic layer of the signal pads is arranged at a lower level with respect to each second upper terminal layer of the power pads.

8. A semiconductor device comprising:
a die of a semiconductor material;
a support electrically connected to the die;
a plurality of power pads, each power pad being separated from an adjacent power pad by a first pitch, said first pitch being defined as the shortest distance between two adjacent power pads; and
a plurality of signal pads, each signal pad being separated from an adjacent signal pad by a second pitch, said second pitch being defined as the shortest distance between two adjacent signal pads;
wherein, the first pitch is wider than the second pitch, and each power pad is higher than each signal pad.

9. The semiconductor device of claim 8 wherein said first pitch is equal or more than 90 microns, and said second pitch is less than 90 microns.

10. The semiconductor device according to claim 8 wherein said signal pads and said power pads are implemented in distinct regions of the die of semiconductor material.

11. The semiconductor device according to claim 8 wherein said signal pads have a multilayer structure comprising metallic layers alternated by insulating material layers and upperly ending with an upper terminal metallic material layer.

12. The semiconductor device according to claim 11 wherein said upper terminal metallic material layer of said signal pads has a thickness less than or equal to 2 microns.

13. The semiconductor device according to claim 8 wherein said power pads have a multilayer structure comprising first metallic layers alternated by insulating material layers and upperly ending with a second upper terminal metallic material layer.

14. The semiconductor device according to claim 13 wherein said second upper terminal metallic material layer of said power pads is more than 2 microns thick.

15. The semiconductor device according to claim 14 wherein each upper terminal metallic layer of the signal pads is arranged at a lower level with respect to each second upper terminal layer of the power pads.

16. A semiconductor device comprising:
a die of semiconductor material;
a plurality of first conductive stripes on a first region of the die, each first conductive stripe being separated from an adjacent one of the first conductive stripes by a first distance;
a plurality of second conductive stripes on a second region of the die, each second conductive stripe being separated from an adjacent one of the second conductive stripes by a second distance;
a plurality of insulating layers overlying each of the first and second conductive stripes; and
a plurality of external conductive layers overlying the insulating layers that are overlying the first conductive stripes,
wherein, the first distance is greater than the second distance, and each of the external conductive layer is more than 2 microns in thickness.

17. The semiconductor device of claim 16 wherein the first distance equals or is greater than 90 microns, and the second distance is less than 90 microns.

18. The semiconductor device of claim 16 wherein each of the first and second conductive stripes comprises a metallic material.

* * * * *